(12) United States Patent
Sei et al.

(10) Patent No.: US 10,634,702 B2
(45) Date of Patent: Apr. 28, 2020

(54) CURRENT SENSOR

(71) Applicant: Yazaki Corporation, Tokyo (JP)

(72) Inventors: Makoto Sei, Shizuoka (JP); Toshiaki Fukuhara, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 107 days.

(21) Appl. No.: 15/959,414

(22) Filed: Apr. 23, 2018

(65) Prior Publication Data

US 2018/0321283 A1 Nov. 8, 2018

(30) Foreign Application Priority Data

May 8, 2017 (JP) .................................. 2017-092340

(51) Int. Cl.
*G01R 15/20* (2006.01)
*G01R 3/00* (2006.01)
*G01R 19/00* (2006.01)
*H01F 3/14* (2006.01)
*G01R 1/18* (2006.01)

(52) U.S. Cl.
CPC ............. *G01R 15/207* (2013.01); *G01R 3/00* (2013.01); *G01R 15/202* (2013.01); *G01R 19/0092* (2013.01); *H01F 3/14* (2013.01); *G01R 1/18* (2013.01)

(58) Field of Classification Search
CPC .......................... G01R 15/207; G01R 19/0092; G01R 15/202; G01R 3/00; G01R 1/18; H01F 3/14
See application file for complete search history.

(56) References Cited

U.S. PATENT DOCUMENTS

| 2007/0164727 A1* | 7/2007 | Racz | .................... G01R 15/207 324/142 |
| 2013/0214593 A1* | 8/2013 | Ohashi | .................... B60R 16/03 307/10.1 |
| 2015/0260762 A1 | 9/2015 | Sakamoto et al. | |

FOREIGN PATENT DOCUMENTS

| JP | 2008-224260 A | 9/2008 |
| JP | 2014-109518 A | 6/2014 |

\* cited by examiner

*Primary Examiner* — Daniel R Miller
(74) *Attorney, Agent, or Firm* — Sughrue Mion, PLLC

(57) ABSTRACT

A current sensor includes: a magnetic core member including a core main body obtained by forming a slit-shaped gap portion along a tube axis direction in a tube that surrounds a conductive member, which is an object to be energized, on an inner side with a clearance, the magnetic core member being configured to generate a magnetic flux corresponding to a current flowing through the conductive member; a magnetic sensor configured to output a signal corresponding to magnetic flux density in the gap portion; and a magnetic shield member including a shield main body that surrounds the core main body from an outer side of the core main body with a clearance, the magnetic shield member being configured to block magnetism between inside and outside of the shield main body by the shield main body.

8 Claims, 7 Drawing Sheets

CURRENT SENSOR

CROSS-REFERENCE TO RELATED APPLICATION(S)

The present application claims priority to and incorporates by reference the entire contents of Japanese Patent Application No. 2017-092340 filed in Japan on May 8, 2017.

BACKGROUND OF THE INVENTION

1. Field of the Invention

The present invention relates to a current sensor.

2. Description of the Related Art

A current sensor measuring a current flowing through a conductive member (such as bus bar) has been known. The current sensor includes a magnetic core member that surrounds the conductive member on the inner side and is configured to generate a magnetic flux corresponding to a current flowing through the conductive member, and a magnetic detection element (such as Hall element) outputting a signal corresponding to the magnetic flux of the magnetic core member. For example, the current sensor of this type is disclosed in Japanese Patent Application Laid-open No. 2014-109518.

Magnetic flux density around the magnetic detection element may change due to external factors other than the current flowing through the conductive member. Thus, in the current sensor, if the magnetic flux density changes due to the external factors, the detection accuracy of the current flowing through the conductive member may be decreased. There is still a room for improvement in view of the above.

SUMMARY OF THE INVENTION

It is therefore an object of the present invention to provide a current sensor capable of improving current detection accuracy.

In order to achieve the above mentioned object, a current sensor according to one aspect of the present invention includes a magnetic core member including a core main body obtained by forming a slit-shaped gap portion along a tube axis direction in a tube that surrounds a conductive member, which is an object to be energized, on an inner side with a clearance, the magnetic core member being configured to generate a magnetic flux corresponding to a current flowing through the conductive member; a magnetic sensor configured to output a signal corresponding to magnetic flux density in the gap portion; and a magnetic shield member including a shield main body that surrounds the core main body from an outer side of the core main body with a clearance, the magnetic shield member being configured to block magnetism between inside and outside of the shield main body by the shield main body.

According to another aspect of the present invention, in the current sensor, it is possible to further include that a sensor housing member housing the magnetic core member, the magnetic sensor, and the magnetic shield member, wherein the sensor housing member includes: a housing chamber housing the magnetic core member, the magnetic sensor, and the magnetic shield member; and a positioning and holding mechanism holding the magnetic core member and the magnetic shield member with a clearance between the magnetic core member and the magnetic shield member.

According to still another aspect of the present invention, in the current sensor, it is possible to configure that the positioning and holding mechanism includes: a core position regulating portion configured to regulate a relative position of the magnetic core member in the housing chamber from an inner side of the magnetic core member; shield holding portions sandwiching the magnetic shield member from an outer side of the magnetic shield member in order to fix a relative position of the magnetic shield member in the housing chamber; and a shield position regulating portion configured to regulate the relative position of the magnetic shield member in the housing chamber in a direction intersecting a sandwiching direction of the shield holding portions.

According to still another aspect of the present invention, in the current sensor, it is possible to configure that in an alternate current circuit including a plurality of the conductive members, a combination of the magnetic core member, the magnetic sensor, and the magnetic shield member is provided for each of the conductive members.

According to still another aspect of the present invention, in the wire harness, it is possible to configure that the magnetic sensor is a Hall IC including a Hall element as a magnetic detection element.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

A current sensor according to an embodiment of the present invention is described in detail below with reference to the accompanying drawings. The present invention is not limited by the embodiment.

Embodiment

A current sensor according to one embodiment of the present invention is described with reference to FIG. 1 to FIG. 8.

Figure 1:
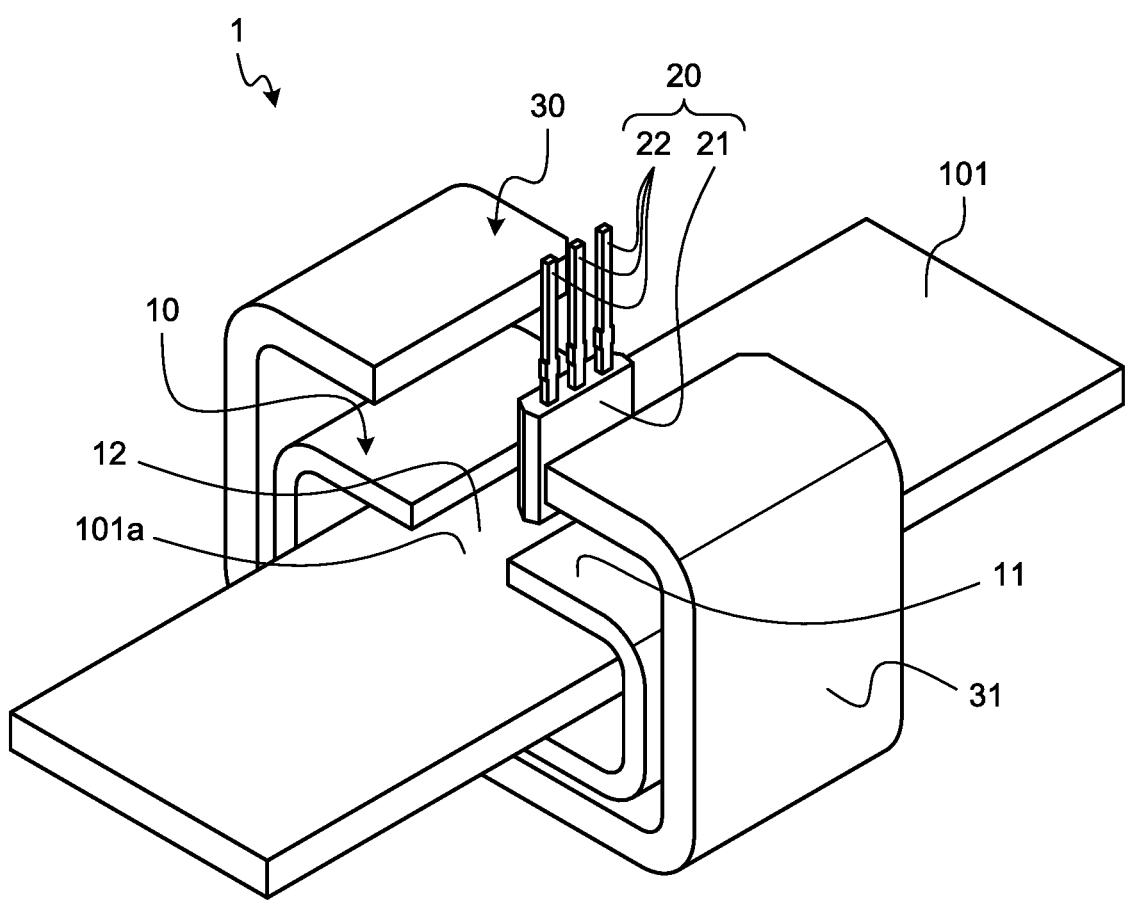
FIG. 1 is a perspective view illustrating a current sensor according to an embodiment.
Figure 2:
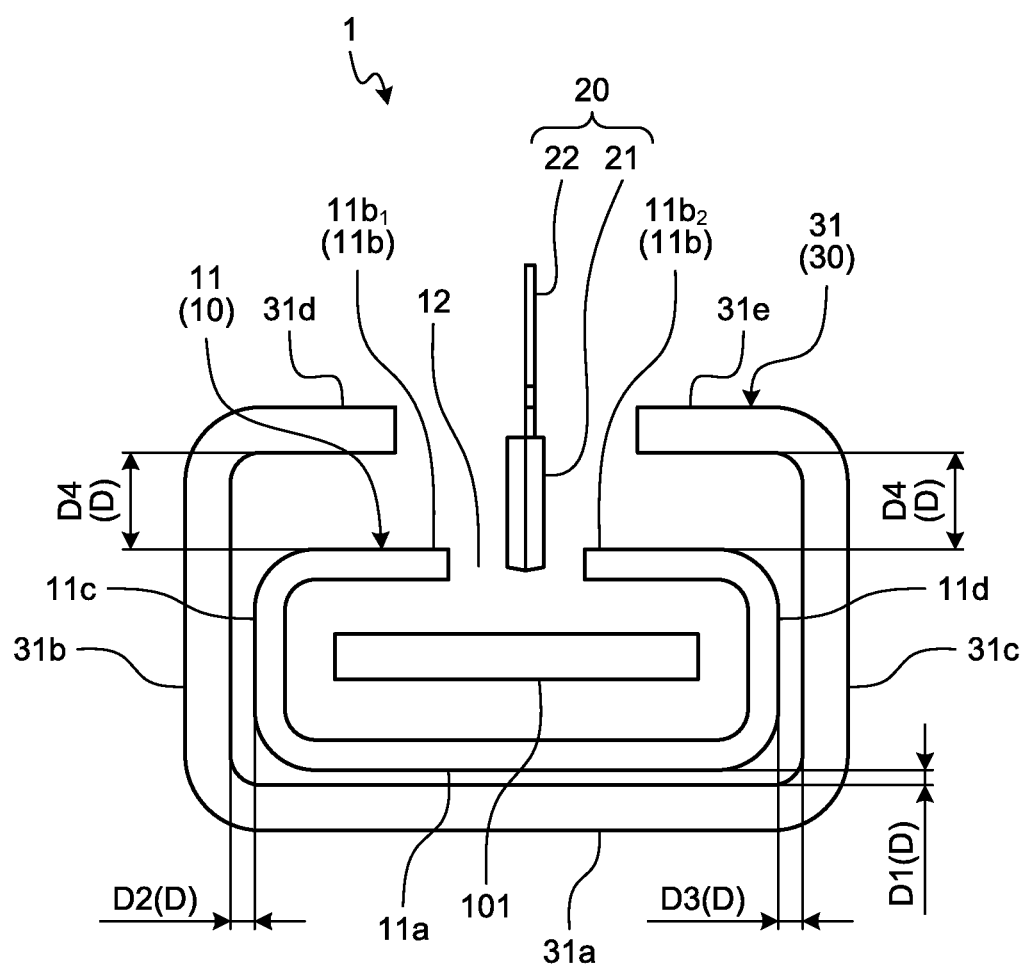
FIG. 2 is a plan view of the current sensor according to the embodiment as seen from tube axis direction.

Reference symbol 1 in FIG. 1 and FIG. 2 represents a current sensor in the present embodiment. The current sensor 1 is a sensor configured to measure a current flowing through a conductive member 101 (FIG. 1 and FIG. 2), which is an object to be energized. A bus bar made of conductive material such as metal and formed into a plate is herein exemplified as the conductive member 101. The current sensor 1 includes a magnetic core member 10, a magnetic sensor 20, and a magnetic shield member 30.

The magnetic core member 10 is a member configured to generate a magnetic flux corresponding to the current flowing through the conductive member 101, and is formed from magnetic material such as ferrite. The magnetic core member 10 has a core main body 11. The main shape of the core main body 11 is a tube that surrounds the conductive member 101 inward with an interval. A slit-shaped gap portion 12 along a tube axis direction is formed in the tube.

Figure 3:
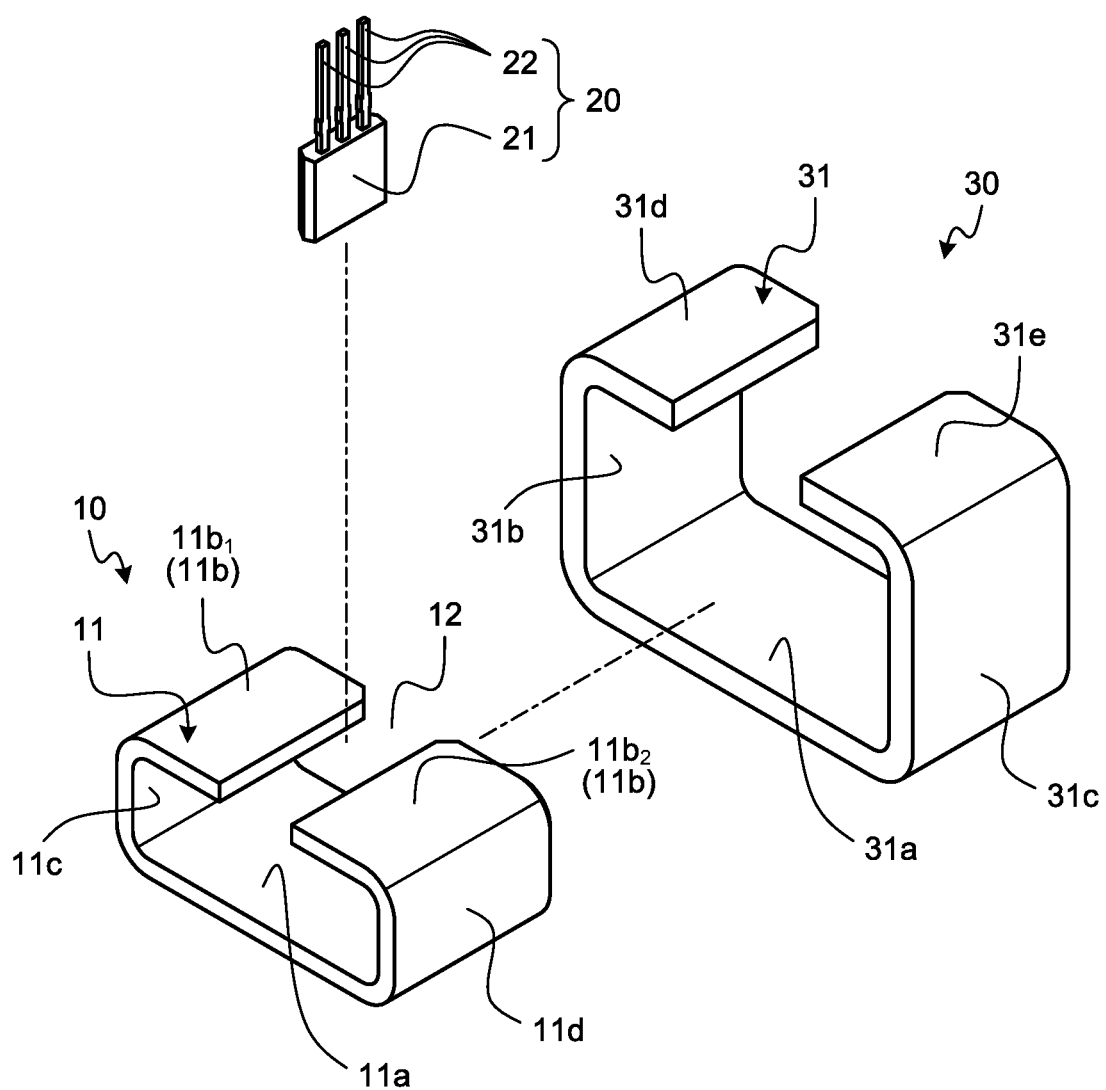
FIG. 3 is an exploded perspective view of the current sensor according to the embodiment.

In the exemplified core main body 11, the gap portion 12 is provided in one of four walls (first to fourth walls 11a to 11d) of the rectangular tube (FIG. 2 and FIG. 3). The core main body 11 has rectangular first and second walls 11a and 11b that are disposed such that flat surfaces thereof are opposed to each other so as to be away from each other with a clearance and rectangular third and fourth walls 11c and 11d that are disposed such that flat surfaces thereof are opposed to each other so as to be away from each other with a clearance in a direction orthogonal to the direction in which the first and second walls 11a and 11b are disposed to be opposed to each other. In the core main body 11, the rectangular gap portion 12 is provided at the center of the second wall 11b. Thus, the second wall 11b is divided by the gap portion 12 into a first piece 11b₁ on the third wall 11c side and a second piece 11b₂ on the fourth wall 11d side.

In the magnetic core member 10, the conductive member 101 is inserted inside the core main body 11 along the tube axis direction, and the conductive member 101 is disposed to be opposed to the gap portion 12 on the inner side of the core main body 11. In the present exemplification, the conductive member 101 is disposed such that one flat surface thereof is opposed to the gap portion 12. A part of the conductive member 101 that is disposed to be opposed to the gap portion 12 serves as a region subjected to current measurement (hereinafter referred to as "current measurement subject portion") 101a (FIG. 1).

The magnetic sensor 20 is configured to output a signal corresponding to magnetic flux density in the gap portion 12. The magnetic sensor 20 includes a sensor main body 21 having a magnetic detection element, and conductive lead wires 22 serving to output the signal (FIG. 1 to FIG. 3).

In the present exemplification, a Hall integrated circuit (IC) is used as the magnetic sensor 20. Although not illustrated, the Hall IC includes a Hall element as a magnetic detection element and an amplifier circuit configured to amplify an output signal of the Hall element. The sensor main body 21 contains the Hall element and the amplifier circuit. The Hall element outputs a signal (output signal) of a Hall voltage corresponding to magnetic flux density. For example, the Hall element is provided at a position away from substantially the lateral center of the current measurement subject portion 101a of the conductive member 101 by a predetermined distance in a direction orthogonal to the flat surface of the conductive member 101. In the present exemplification, the sensor main body 21 in the magnetic sensor 20 is disposed in the gap portion 12 such that the Hall element is disposed as described above. In the magnetic sensor 20, the Hall element outputs a signal of a Hall voltage corresponding to magnetic flux density in the gap portion 12, and the amplifier circuit amplifies the output signal. The magnetic sensor 20 outputs the amplified output signal from the lead wires 22.

The magnetic shield member 30 has a shield main body 31 that surrounds the core main body 11 of the magnetic core member 10 from the outer side with a clearance D, and blocks magnetism between the inside and outside of the shield main body 31 by the shield main body 31. The magnetic shield member 30 is formed from magnetic material such as ferrite.

The shield main body 31 has at least a rectangular first wall 31a that is disposed to be opposed to the first wall 11a of the core main body 11 on the outer side of the first wall 11a, a rectangular second wall 31b that is disposed to be opposed to the third wall 11c of the core main body 11 on the outer side of the third wall 11c, and a rectangular third wall 31c that is disposed to be opposed to the fourth wall 11d of the core main body 11 on the outer side of the fourth wall 11d (FIG. 2 and FIG. 3). The first wall 11a and the first wall 31a are disposed to be opposed to each other such that flat surfaces thereof are separated away from each other by a clearance D1. The exemplified first wall 31a is shaped and disposed so as to be capable of covering the first wall 11a from the outer side. The third wall 11c and the second wall 31b are disposed to be opposed to each other such that flat surfaces thereof are separated away from each other by a clearance D2. The exemplified second wall 31b is shaped and disposed so as to be capable of covering the third wall 11c from the outer side. The fourth wall 11d and the third wall 31c are disposed to be opposed to each other such that flat surfaces thereof are separated away from each other by a clearance D3. The exemplified third wall 31c is shaped and disposed so as to be capable of covering the fourth wall 11d from the outer side. In the shield main body 31, the second wall 31b and the third wall 31c are provided to extend vertically from two opposed side portions of the first wall 31a, respectively. In the shield main body 31 formed by the three walls, the magnetic sensor 20 is disposed at a rectangular opening formed by side portions of respective free ends of the second wall 31b and the third wall 31c. The opening is disposed to be opposed to the gap portion 12 of the magnetic core member 10 so as to be separated away from the gap portion 12 on the outer side of the core main body 11.

The exemplified shield main body 31 further has a rectangular first piece 31d that is disposed to be opposed to the first piece 11b₁ of the core main body 11 on the outer side of the first piece 11b₁, and a rectangular second piece 31e that is disposed to be opposed to the second piece 11b₂ of the core main body 11 on the outer side of the second piece 11b₂ (FIG. 2 and FIG. 3). The first piece 11b₁ and the first piece 31d are disposed to be opposed to each other such that flat surfaces thereof are separated away from each other by a clearance D4. The second piece 11b₂ and the second piece 31e are disposed to be opposed to each other such that flat surfaces thereof are separated away from each other by the clearance D4. The first piece 31d and the second piece 31e reduce the above-mentioned opening formed by the second wall 31b and the third wall 31c, and reduces the entry of external magnetic field to the inside of the shield main body 31 through the opening. Specifically, the inside of the shield main body 31 is more affected by external magnetic field as the opening disposed to be opposed to the gap portion 12 becomes larger. In the exemplified first piece 31d and second piece 31e, however, the opening can be narrowed as compared with the above-mentioned opening formed by the second wall 31b and the third wall 31c, and hence the influence of the external magnetic field inside the shield main body 31 can be reduced. In the exemplified shield main body 31, in consideration of the influence of external electromagnetic field, the first piece 31d is provided to extend vertically from the end portion of the second wall 31b toward the third wall 31c (second piece 31e), and the second piece 31e is provided to extend vertically from the end portion of the third wall 31c toward the second wall 31b (first piece 31d).

Figure 4:
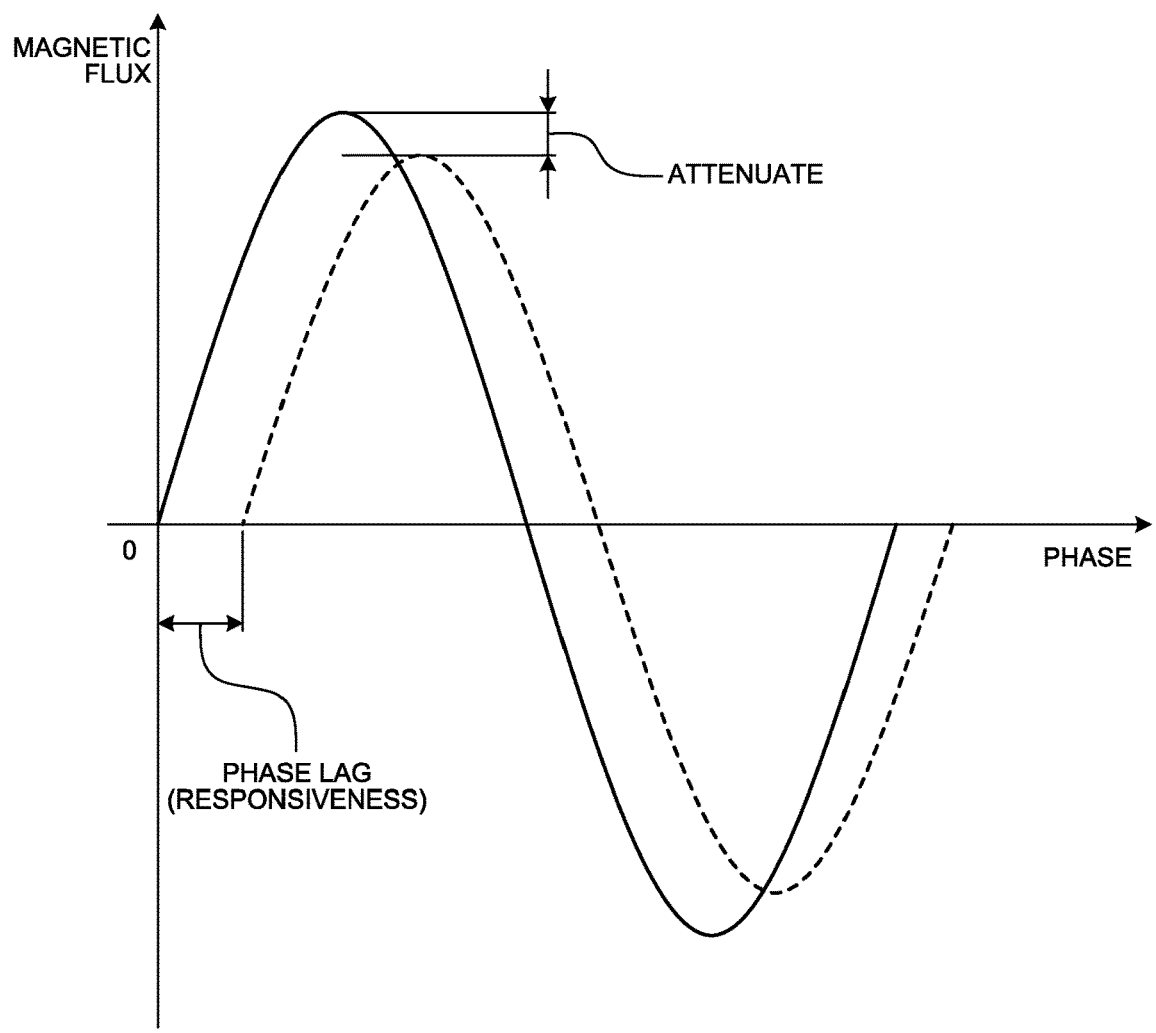
FIG. 4 is a diagram for describing phase lag of magnetic flux and attenuation of magnetic flux density depending on the absence of clearances.

Meanwhile, in the current sensor 1, if the magnetic core member 10 and the magnetic shield member 30 contact with each other, magnetic saturation occurs at the contact portion, and magnetic flux density around the sensor main body 21 (Hall element) may be changed due to external factors. In particular, the magnetic saturation is highly likely to occur at the contact portion when a large current flows through the conductive member 101 in a high-frequency alternate current (AC) circuit. FIG. 4 illustrates how the magnetic saturation affects the current detection accuracy. The solid line in FIG. 4 indicates a magnetic flux generated by a current flowing through the conductive member 101 in an AC circuit. The broken line in FIG. 4 indicates a magnetic flux generated around the sensor main body 21 (Hall element) when the magnetic saturation occurs. It is understood from FIG. 4 that when the magnetic saturation occurs, phase lag of the magnetic flux may occur or magnetic flux density may attenuate. Thus, when the magnetic saturation occurs, the linearity between the magnetic flux density around the sensor main body 21 (Hall element) and the current is not maintained in some cases. The exemplified magnetic sensor 20 detects the current flowing through the conductive member 101 by using the linearity. Thus, if the magnetic core member 10 and the magnetic shield member 30 contact with each other, the detection accuracy of the current of the current sensor 1 may be decreased due to magnetic saturation at the contact portion.

Figure 5:
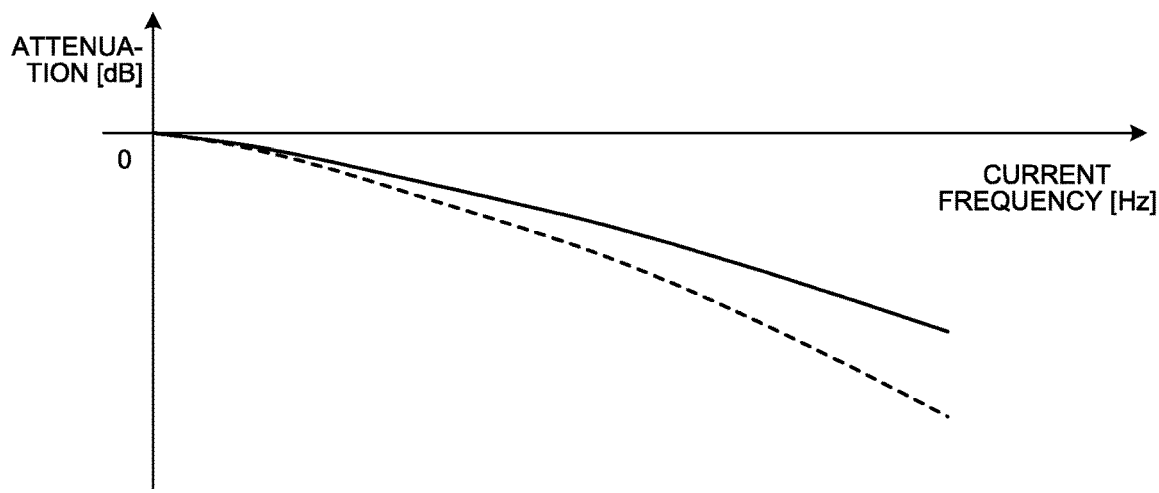
FIG. 5 is an explanatory diagram in which attenuation characteristics of magnetic flux density are compared for the cases with and without clearances.

In the current sensor 1 in the present embodiment, however, the magnetic core member 10 and the magnetic shield member 30 are disposed to be separated away from each other by the clearance D as described above, and hence the occurrence of magnetic saturation can be suppressed. Thus, in the current sensor 1, the magnetic flux density of the magnetic shield member 30 can be reduced to suppress a change in magnetic flux density around the sensor main body 21 (Hall element) caused by external factors, and hence the detection accuracy of the current flowing through the conductive member 101 can be improved. FIG. 5 illustrates attenuation characteristics of magnetic flux density around the sensor main body 21 (Hall element). The solid line in FIG. 5 indicates the current sensor 1 in which the magnetic core member 10 and the magnetic shield member 30 are disposed with the clearance D. The broken line in FIG. 5 indicates a current sensor 1 in which the magnetic core member 10 and the magnetic shield member 30 are disposed without the clearance D. It is understood from FIG. 5 that attenuation characteristics are improved in the former case where the clearance D is provided as compared with the latter case where the clearance D is not provided. In the former case, as compared with the latter case, the improvable value of the attenuation characteristics becomes larger as the frequency of the current flowing through the conductive member 101 becomes higher.

In order to obtain the effect described above, it is desired to narrow the clearance D (in particular, clearances D1 to D3) as much as possible. Productivity of the current sensor 1 is taken into consideration in determining the clearance D. For example, a specific example described later is considered. In this case, the clearance D is narrowed to the extent that a positioning and holding mechanism 60 can be produced in consideration of the removal of the positioning and holding mechanism 60 from a mold.

The current sensor 1 is provided for each conductive member 101 subjected to current measurement. For example, in an AC circuit having conductive members 101, a combination of the magnetic core member 10, the magnetic sensor 20, and the magnetic shield member 30 may be provided for each conductive member 101.

Figure 6:
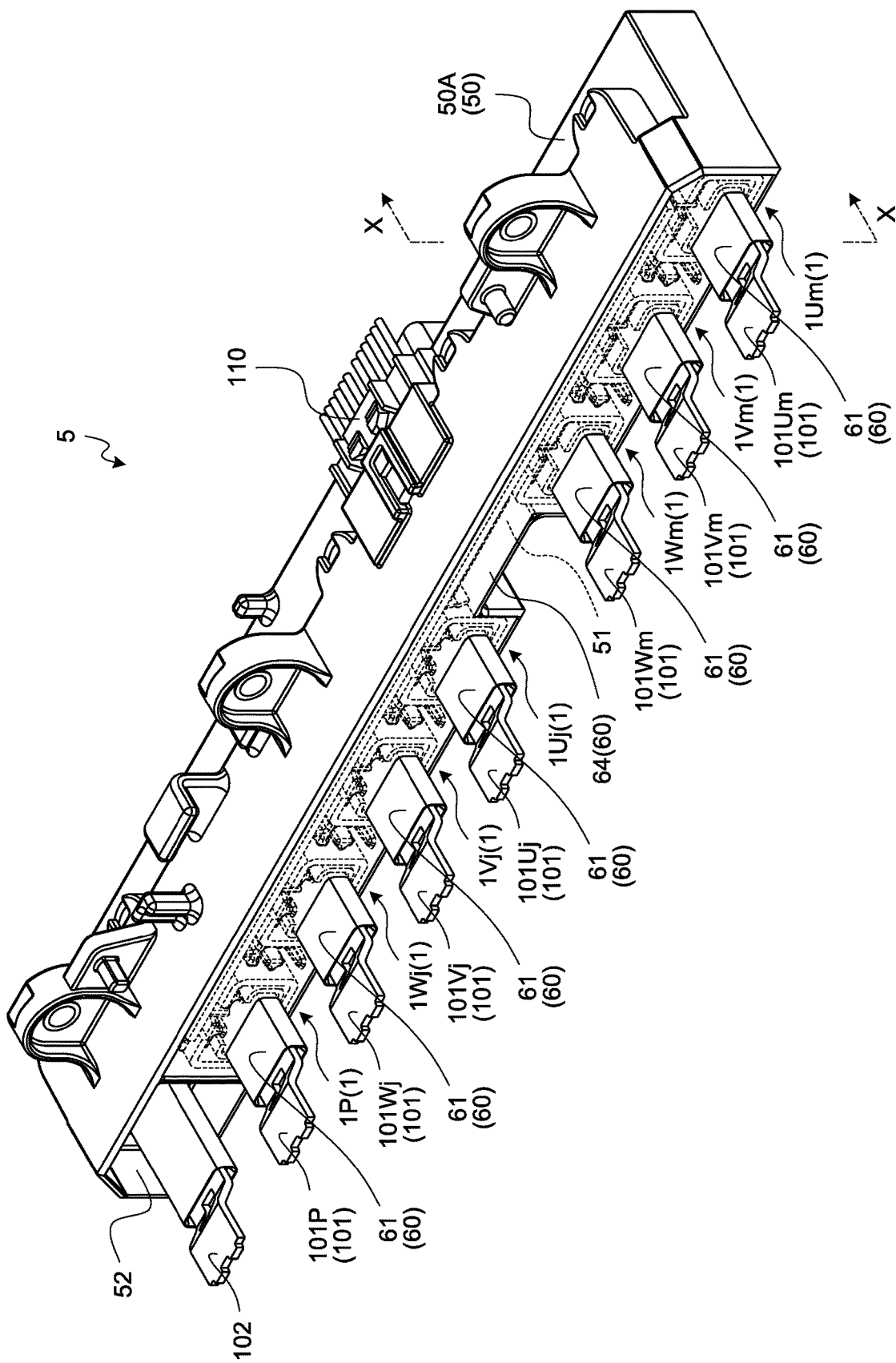
FIG. 6 is a diagram for describing one example of the application of the current sensor according to the embodiment, and is a perspective view illustrating a current sensor device for a PCU.
Figure 7:
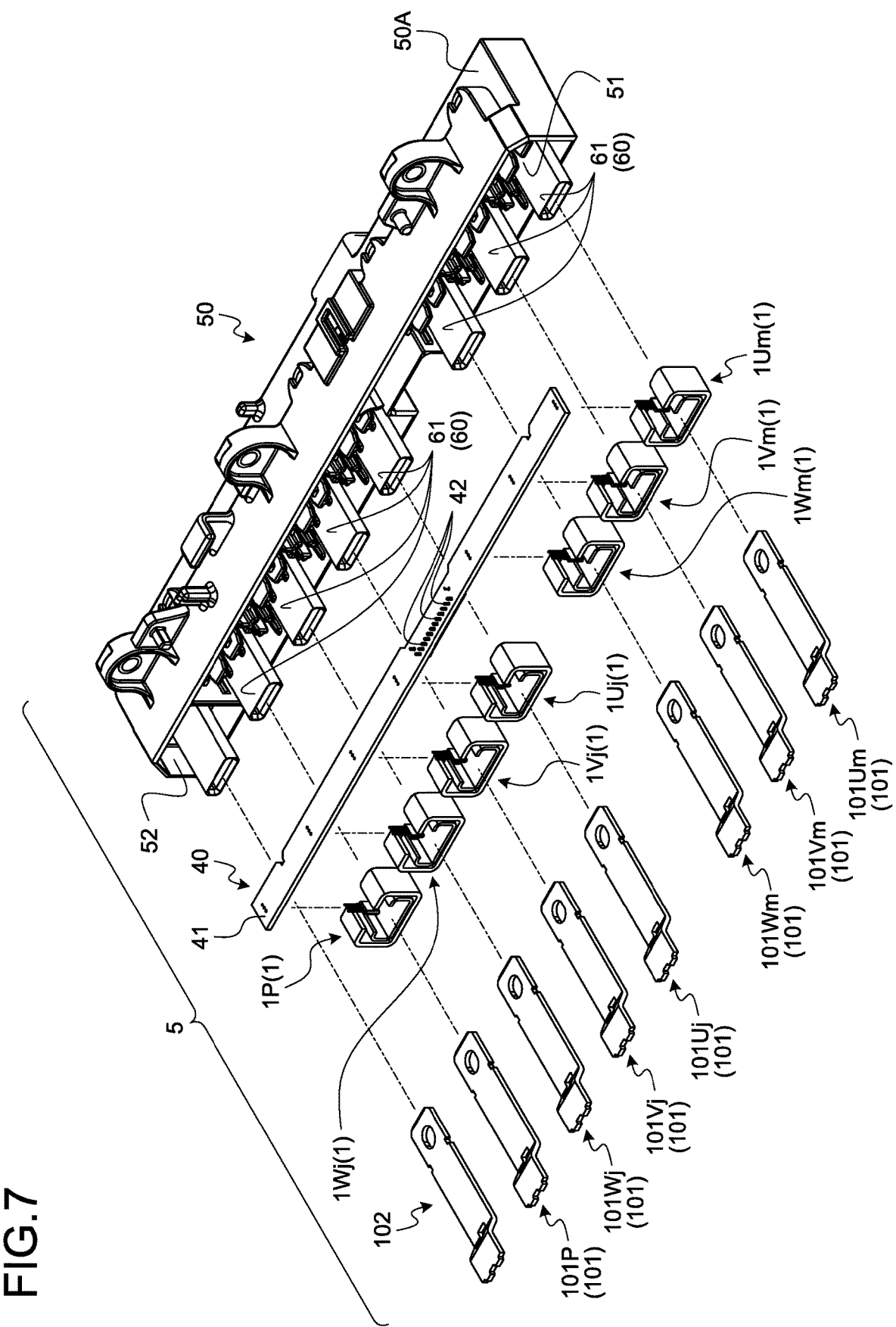
FIG. 7 is an exploded perspective view of the current sensor device.

One example of the application of the current sensor 1 is described below. Although not illustrated herein, the current sensor 1 in the following description is applied to a power control unit (PCU) for vehicles (such as hybrid vehicle and electric vehicle) including a rotating machine (electric motor) as a drive source. The PCU includes an inverter (not shown) configured to drive a rotating machine, and a current sensor (hereinafter referred to as "current sensor device" for the sake of description) 5 configured to measure a current for each phase (each conductive member 101) in a three-phase AC circuit in the inverter (FIG. 6 and FIG. 7). In FIG. 7, the illustration of a holder 64 described later is omitted.

In the current sensor device 5, the current sensor 1 is provided for each phase. For example, the current sensor device 5 includes, as the current sensors 1, three current sensors 1Um, 1Vm, and 1Wm respectively provided for U phase, V phase, and W phase on a first rotating machine (motor) side and three current sensors 1Uj, 1Vj, and 1Wj respectively provided for U phase, V phase, and W phase on a second rotating machine (generator) side.

The current sensors 1Um, 1Vm, and 1Wm on the first rotating machine side measure currents flowing through conductive members 101Um, 101Vm, and 101Wm, which are conductive members 101 on the first rotating machine side, respectively. The conductive members 101Um, 101Vm, and 101Wm are electrically connected to the U phase, the V phase, and the W phase on the first rotating machine side, respectively, and are electrically connected to the U phase, the V phase, and the W phase on the inverter side, respectively. For example, the conductive members 101Um, 101Vm, and 101Wm are fixed by screws to a U-phase conductive member (not shown), a V-phase conductive member (not shown), and a W-phase conductive member (not shown) on the first rotating machine side, respectively. On the other hand, for example, the conductive members 101Um, 101Vm, and 101Wm are fixed by welding to a U-phase conductive member (not shown), a V-phase conductive member (not shown), and a W-phase conductive member (not shown) on the inverter side, respectively.

The current sensors 1Uj, 1Vj, and 1Wj on the second rotating machine side measure currents flowing through the conductive members 101Uj, 101Vj, and 101Wj, which are conductive members 101 on the second rotating machine side, respectively. The conductive members 101Uj, 101Vj, and 101Wj are electrically connected to the U phase, the V phase, and the W phase on the second rotating machine side, respectively, and are electrically connected to the U phase, the V phase, and the W phase on the inverter side, respectively. For example, the conductive members 101Uj, 101Vj, and 101Wj are fixed by screws to a U-phase conductive member (not shown), a V-phase conductive member (not shown), and a W-phase conductive member (not shown) on the second rotating machine side, respectively. On the other hand, for example, the conductive members 101Uj, 101Vj, and 101Wj are fixed by welding to the U-phase conductive member (not shown), the V-phase conductive member (not shown), and the W-phase conductive member (not shown) on the inverter side, respectively.

The current sensor device 5 includes, as the current sensor 1, a current sensor 1P provided for a positive electrode of a controller power source (not shown). The current sensor 1P relates to a conductive member 101 (conductive member 101P) electrically connected to a positive electrode of a controller power source, and measures a current flowing through the conductive member 101P.

The current sensor device 5 includes the current sensors 1Um, 1Vm, 1Wm, 1Uj, 1Vj, 1Wj, and 1P as well as corresponding conductive members 101Um, 101Vm, 101Wm, 101Uj, 101Vj, 101Wj, and 101P. The current sensor device 5 further includes a conductive member 102 electrically connected to a negative electrode of the controller power source. Each of the conductive members 101Um, 101Vm, 101Wm, 101Uj, 101Vj, 101Wj, 101P, and 102 is formed as a plate-shaped bus bar. In the current sensor device 5, the same components are used for the conductive members 101Um, 101Vm, 101Wm, 101Uj, 101Vj, 101Wj, 101P, and 102.

The current sensor 1 includes a circuit board 40 to which output signals from the lead wires 22 in the magnetic sensors 20 are input (FIG. 7). The circuit board 40 outputs an output signal based on the output signal of the magnetic sensor 20. For example, the circuit board 40 calculates a current value based on the output signal (signal of Hall voltage) of the magnetic sensor 20, and outputs an output signal corresponding to the current value. For example, the circuit board 40 includes a rectangular plate-shaped main body 41 on which electric circuits are formed, and output terminals 42 electrically connected to the electric circuit, and outputs generated output signals from the output terminals 42. A mating terminal of a mating connector 110 (FIG. 6) is fitted and electrically connected to the output terminal 42. Output signals from the circuit board 40 are transmitted to a signal transmission subject such as an electronic control device (not shown) via the mating connector.

The circuit board 40 may be provided for each current sensor 1. In the exemplified current sensor device 5, only one circuit board 40 is prepared, and the single circuit board 40 is electrically connected to the current sensors 1Um, 1Vm, 1Wm, 1Uj, 1Vj, 1Wj, and 1P. The current sensors 1Um, 1Vm, 1Wm, 1Uj, 1Vj, 1Wj, and 1P are electrically connected to the single circuit board 40 along the longitudinal direction one by one through the lead wires 22. The circuit board 40 is disposed to be opposed to the first piece 31d and the second piece 31e on the outer side of the shield main body 31 of the magnetic shield member 30 for each of the current sensors 1Um, 1Vm, 1Wm, 1Uj, 1Vj, 1Wj, and 1P. The circuit board 40 and the first and second pieces 31d and 31e are disposed to be opposed to each other such that flat surfaces thereof are separated away from each other.

Figure 8:
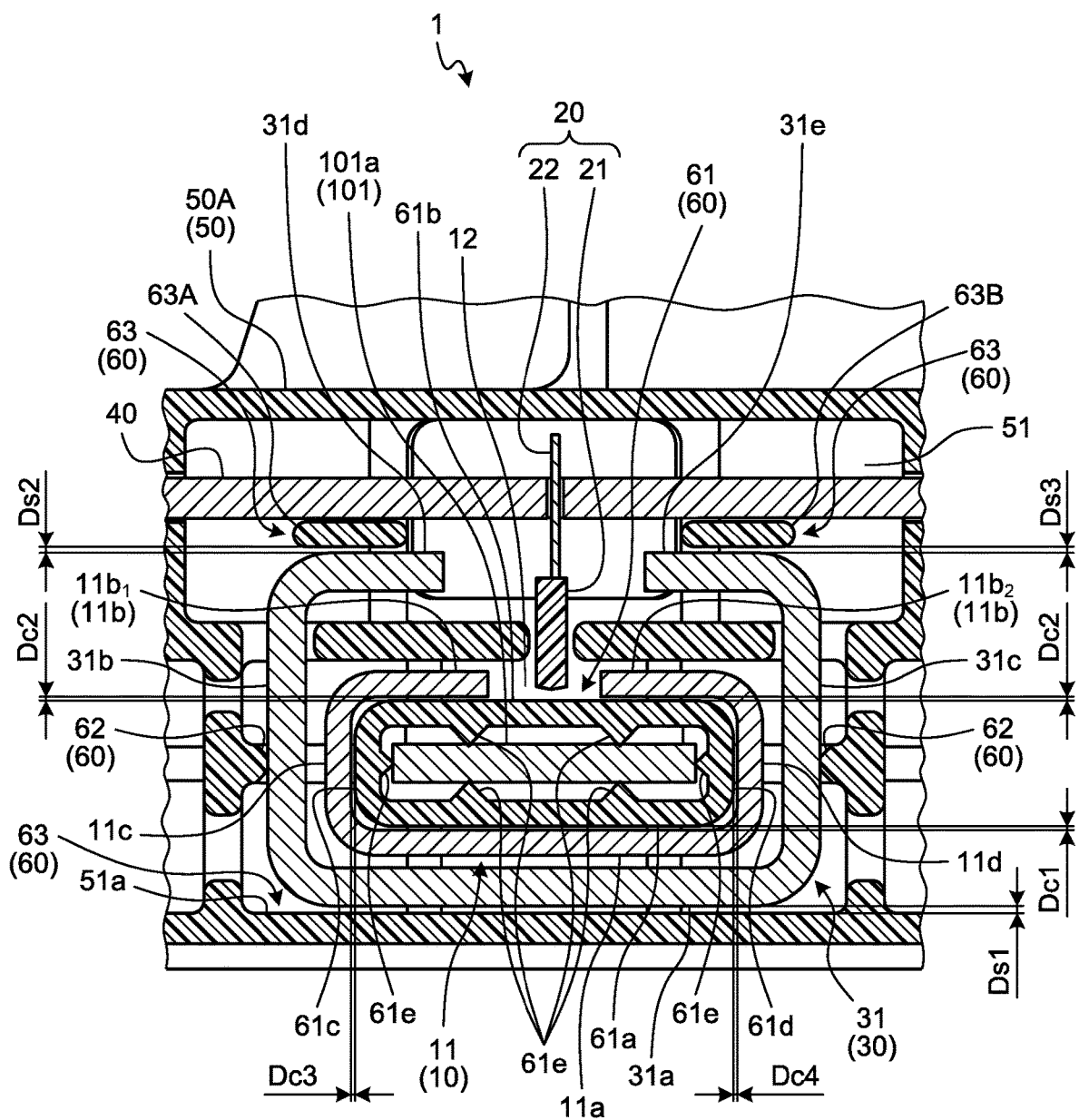
FIG. 8 is a cross-sectional view taken along line X-X in FIG. 6.

The current sensor 1 includes a sensor housing member 50 housing the magnetic core member 10, the magnetic sensor 20, and the magnetic shield member 30 therein (FIG. 6 and FIG. 7). The sensor housing member 50 is formed from an insulating material such as synthetic resin. The sensor housing member 50 is provided with a housing chamber 51 housing the magnetic core member 10, the magnetic sensor 20, and the magnetic shield member 30 therein. The sensor housing member 50 is provided with positioning and holding mechanisms 60 each holding the magnetic core member 10 and the magnetic shield member 30 with the clearance D (FIG. 6 to FIG. 8). The sensor housing member 50 is fixed to the inverter by screws or the like. In FIG. 8, the illustration of the holder 64 described later is omitted.

The sensor housing member 50 may be provided for each current sensor 1. In the exemplified current sensor device 5, only one sensor housing member 50 is prepared. In a housing chamber 51 in the sensor housing member 50, the magnetic core members 10, the magnetic sensors 20, and the magnetic shield members 30 in the current sensors 1Um, 1Vm, 1Wm, 1Uj, 1Vj, 1Wj, and 1P are housed. In addition, the conductive members 101Um, 101Vm, 101Wm, 101Uj, 101Vj, 101Wj, and 101P are housed in the housing chamber 51. In the exemplified sensor housing member 50, a single housing chamber 51 collectively housing the magnetic core members 10, the magnetic sensors 20, and the magnetic shield members 30 for the current sensors 1Um, 1Vm, 1Wm, 1Uj, 1Vj, 1Wj, and 1P therein is formed. In the single housing chamber 51, the current sensors 1Um, 1Vm, 1Wm, 1Uj, 1Vj, 1Wj, and 1P as well as the conductive members 101Um, 101Vm, 101Wm, 101Uj, 101Vj, 101Wj, and 101P are housed in a collective manner. In the exemplified sensor housing member 50, a housing chamber 52 housing a conductive member 102 for negative electrode therein is also formed. For example, in the sensor housing member 50, the housing chambers 51 and 52 are arranged side by side inside a rectangular tubular main body 50A.

On the other hand, one positioning and holding mechanism 60 is prepared for each of the current sensors 1Um, 1Vm, 1Wm, 1Uj, 1Vj, 1Wj, and 1P. Each of the positioning and holding mechanisms 60 is formed integrally with the sensor housing member 50 in the housing chamber 51.

In the current sensor device 5, the shapes and arrangement of the magnetic core member 10, the magnetic sensor 20, and the magnetic shield member 30 and the structure, shape, and arrangement of the positioning and holding mechanism 60 are substantially common to the current sensors 1Um, 1Vm, 1Wm, 1Uj, 1Vj, 1Wj, and 1P. Thus, the positioning and holding mechanism 60 at one location is herein exemplified as a representative of the ones applied to the current sensors 1Um, 1Vm, 1Wm, 1Uj, 1Vj, 1Wj, and 1P.

The positioning and holding mechanism 60 includes a position regulating portion (hereinafter referred to as "core position regulating portion") 61 configured to fix a relative position of the magnetic core member 10 in the housing chamber 51 and regulate the relative position from the inner side of the magnetic core member 10 (FIG. 8). The core position regulating portion 61 has an external shape conforming to the inner shape (parallelepiped shape) of the magnetic core member 10, and protrudes from the wall surface of the housing chamber 51 along the tube axis direction of the magnetic core member 10.

The exemplified core position regulating portion 61 is formed into a rectangular tube that is coaxial with the tube axis of the magnetic core member 10. The core position regulating portion 61 has a rectangular first wall 61a that is disposed to be opposed to the first wall 11a of the core main body 11 on the inner side of the first wall 11a. The first wall 11a and the first wall 61a are disposed to be opposed to each other so as to be away from each other with a clearance Dc1 as a design value (such as median value that does not take design tolerance into consideration). In the present exemplification, respective flat surfaces of the first wall 11a and the first wall 61a are disposed with the clearance Dc1. The core position regulating portion 61 further has a rectangular second wall 61b that is disposed to be opposed to the first piece $11b_1$ and the second piece $11b_2$ of the core main body 11 on the inner side of the first piece $11b_1$ and the second piece $11b_2$. The first and second pieces $11b_1$ and $11b_2$ and the second wall $61b$ are disposed to be opposed to each other so as to be away from each other with a clearance Dc2 as a design value. In the present exemplification, flat surfaces of the first and second pieces $11b_1$ and $11b_2$ and the second wall $61b$ are disposed away from each other with a clearance Dc2. The core position regulating portion 61 further has a rectangular third wall 61c that is disposed to be opposed to the third wall 11c of the core main body 11 on the inner side of the third wall 11c. The third wall 11c and the third wall 61c are disposed to be opposed to each other so as to be away from each other with a clearance Dc3 as a design value. In the present exemplification, flat surfaces of the third wall 11c and the third wall 61c are disposed away from each other with the clearance Dc3. The core position regulating portion 61 further has a rectangular fourth wall 61d that is disposed to be opposed to the fourth wall 11d of the core main body 11 on the inner side of the fourth wall 11d. The fourth wall 11d and the fourth wall 61d are disposed to be opposed to each other so as to be away from each other with a clearance Dc4 as a design value. In the present exemplification, flat surfaces of the fourth wall 11d and the fourth wall 61d are disposed away from each other with the clearance Dc4.

The exemplified core position regulating portion 61 has a parallelepiped space inside. In the inner space of the core position regulating portion 61, the conductive member 101 is inserted along the tube axis direction, and the current measurement subject portion 101a of the conductive member 101 is held. In the inner space of the core position regulating portion 61, holding portions 61e holding the current measurement subject portion 101a are provided.

In the core position regulating portion 61, holding portions 61e are provided for flat surfaces of the current measurement subject portion 101a. The holding portions 61e each have a rib shape whose cross-section orthogonal to the tube axis direction of the core position regulating portion 61 is triangular, and are disposed such that apexes thereof are opposed to each other in a direction of sandwiching the flat surfaces of the current measurement subject portion 101a. In this case, two holding portions 61e are provided for each flat surface of the current measurement subject portion 101a.

In the core position regulating portion 61, the holding portions 61e are further provided for end surfaces of the current measurement subject portion 101a (end surfaces located in direction orthogonal to tube axis direction of core position regulating portion 61). The holding portions 61e each have a rib shape whose cross-section orthogonal to the tube axis direction of the core position regulating portion 61 is triangular, and are disposed such that apexes thereof are opposed to each other in a direction of sandwiching the end surfaces of the current measurement subject portion 101a.

The conductive member 101 is press-fitted into the core position regulating portion 61 while crushing the apexes of the holding portions 61e. The holding portions 61e of the core position regulating portion 61 hold the conductive member 101 from four directions of the flat surfaces and end surfaces of the current measurement subject portion 101a. In this manner, the exemplified core position regulating portion 61 also functions as a position regulating portion configured to fix a relative position of the conductive member 101 in the housing chamber 51.

The positioning and holding mechanism 60 further includes holding portions (hereinafter referred to as "shield holding portions") 62 sandwiching the magnetic shield member 30 from the outer side of the magnetic shield member 30 in order to fix the relative position of the magnetic shield member 30 in the housing chamber 51 (FIG. 8). The shield holding portions 62 are two portions that are disposed to be opposed to each other at a distance between positions at which the magnetic shield member 30 is to be held, and are formed into a rib. Each of the shield holding portions 62 extends from the wall surface of the housing chamber 51 along the tube axis direction of the magnetic core member 10. The shield holding portions 62 are each formed such that the cross-section orthogonal to the tube axis direction is triangular and are disposed such that apexes thereof are opposed to each other in the direction of sandwiching the magnetic shield member 30. The magnetic shield member 30 is press-fitted into the housing chamber 51 while crushing the apexes of the shield holding portions 62. The exemplified shield holding portions 62 sandwich the magnetic shield member 30 in the arrangement direction of the current sensors 1. Thus, in this case, one of the shield holding portions 62 is brought into abutment with the second wall 31b of the magnetic shield member 30, and the other shield holding portion 62 is brought into abutment with the third wall 31c of the magnetic shield member 30.

The positioning and holding mechanism 60 further includes a position regulating portion (hereinafter referred to as "shield position regulating portion") 63 configured to regulate a relative position of the magnetic shield member 30 in the housing chamber 51 in a direction intersecting the sandwiching direction of the shield holding portions 62 (FIG. 8). The exemplified shield position regulating portion 63 regulates the relative position of the magnetic shield member 30 in a direction orthogonal to the sandwiching direction.

The exemplified shield position regulating portion 63 regulates the first wall 31a and the first and second pieces 31d and 31e of the magnetic shield member 30 from the outer side of the magnetic shield member 30.

On the first wall 31a side, a wall surface 51a of the housing chamber 51, which is disposed to be opposed to the first wall 31a on the outer side of the magnetic shield member 30, is used as the shield position regulating portion 63. In the housing chamber 51, the flat surface of the first wall 31a is disposed to be opposed to the wall surface 51a so as to be away from the wall surface 51a with a clearance Ds1 as a design value.

On the first and second pieces 31d and 31e side, a first position regulator 63A that is disposed to be opposed to the first piece 31d on the outer side of the magnetic shield member 30 and a second position regulator 63B that is disposed to be opposed to the second piece 31e on the outer side of the magnetic shield member 30 are provided as the shield position regulating portion 63. The first piece 31d and the first position regulator 63A are disposed to be opposed to each other so as to be away from each other with a clearance Ds2 as a design value. The exemplified first position regulator 63A is formed into a piece, and protrudes from the wall surface of the housing chamber 51 along the tube axis direction of the magnetic core member 10. In the present exemplification, flat surfaces of the first piece 31d and the first position regulator 63A are disposed away from each other with a clearance Ds2. The second piece 31e and the second position regulator 63B are disposed to be opposed to each other so as to be away from each other with a clearance Ds3 as a design value. The exemplified second position regulator 63B is formed into a piece, and protrudes from the wall surface of the housing chamber 51 along the tube axis direction of the magnetic core member 10. In the present exemplification, flat surfaces of the second piece 31e and the second position regulator 63B are disposed away from each other with a clearance Ds3.

In the positioning and holding mechanism 60, the core position regulating portion 61 and the shield position regulating portion 63 are formed so as to satisfy a first requirement that the magnetic core member 10 and the magnetic shield member 30 do not abut each other even when the magnetic core member 10 and the magnetic shield member 30 come as close to each other as possible in the direction intersecting with (in the present exemplification, direction orthogonal to) the sandwiching direction of the shield holding portions 62 within design tolerances. Furthermore, the core position regulating portion 61 is formed so as to satisfy a second requirement that the magnetic core member 10 does not abut the magnetic shield member 30 in the sandwiching direction of the shield holding portion 62 even when the magnetic core member 10 comes as close as possible to the magnetic shield member 30 in the sandwiching direction. The above-mentioned various clearances Dc1 to Dc4 and Ds1 to Ds3 are set to sizes satisfying the first and second requirements.

In the current sensor 1, the magnetic core member 10 and the magnetic shield member 30 are arranged in the housing chamber 51 with the positional relation described above, and the magnetic sensor 20 and the circuit board 40 are arranged in the housing chamber 51 while being electrically connected to each other. The positioning and holding mechanism 60 includes the holder 64 configured to maintain the arrangement of the magnetic core member 10, the magnetic sensor 20, the magnetic shield member 30, and the circuit board 40 in the housing chamber 51 (FIG. 6). The exemplified holder 64 is a buried member that fills various clearances in the housing chamber 51, and is a member obtained by curing a liquid potting agent (such as epoxy resin) filled in the housing chamber 51. In the housing chamber 51, after the magnetic core member 10 and other members are disposed, a potting agent is filled and cured to form the holder 64.

The positioning and holding mechanism 60 enables the magnetic core member 10 and the magnetic shield member 30 to be disposed away from each other with the clearance D by the core position regulating portion 61, the shield holding portion 62, and the shield position regulating portion 63 even if variation in assembly occurs between the magnetic core member 10 and the magnetic shield member 30 when the magnetic core member 10 and the magnetic shield member 30 are assembled to the housing chamber 51. Furthermore, the positioning and holding mechanism 60 can hold the clearance D by the holder 64. In addition, even when an external input is applied to the current sensor 1 from the vehicle side, the positioning and holding mechanism 60 can maintain the magnetic core member 10 and the magnetic shield member 30 from being away from each other with the clearance D because vibration resistance and impact resistance are improved by the holder 64.

In the current sensor 1, the positioning and holding mechanism 60 enables the magnetic core member 10 and the magnetic shield member 30 to be disposed away from each other with the clearance D and can suppress the occurrence of magnetic saturation, and hence the detection accuracy of the current flowing through the conductive member 101 can be improved. Then, in the current sensor device 5, the current sensors 1 are formed for the first rotating machine, the second rotating machine, and the positive electrode of the controller power source (current sensors 1Um, 1Vm, 1Wm, 1Uj, 1Vj, 1Wj, and 1P). Consequently, in the current sensor device 5, the detection accuracy of the current sensors 1Um, 1Vm, 1Wm, 1Uj, 1Vj, 1Wj, and 1P for the currents flowing through the respective conductive members 101Um, 101Vm, 101Wm, 101Uj, 101Vj, 101Wj, and 101P can be improved.

In the current sensor according to the present embodiment, the magnetic core member and the magnetic shield member are disposed with a clearance from each other, and hence the occurrence of magnetic saturation can be suppressed. Consequently, in the current sensor, the magnetic flux density of the magnetic shield member can be reduced to suppress a change in magnetic flux density around the magnetic detection element caused by external factors, and hence the detection accuracy of the current flowing through the conductive member can be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A current sensor, comprising:
 a magnetic core member including a core main body obtained by forming a slit-shaped gap portion along a tube axis direction in a tube that surrounds a conductive member, which is an object to be energized, on an inner side with a clearance, the magnetic core member being configured to generate a magnetic flux corresponding to a current flowing through the conductive member;
 a magnetic sensor configured to output a signal corresponding to magnetic flux density in the gap portion;
 a magnetic shield member including a shield main body that surrounds the core main body from an outer side of the core main body with a clearance, the magnetic shield member being configured to block magnetism between inside and outside of the shield main body by the shield main body; and
 a sensor housing member housing the magnetic core member, the magnetic sensor, and the magnetic shield member,
 wherein the sensor housing member includes:
  a housing chamber housing the magnetic core member, the magnetic sensor, and the magnetic shield member; and
  a positioning and holding mechanism holding the magnetic core member and the magnetic shield member with a clearance between the magnetic core member and the magnetic shield member, and
 wherein the positioning and holding mechanism includes:
  a core position regulating portion configured to regulate a relative position of the magnetic core member in the housing chamber from an inner side of the magnetic core member; and
  shield holding portions formed as ribs that extend from a surface of the housing chamber and that are configured to sandwich the magnetic shield member from an outer side of the magnetic shield member in order to fix a relative position of the magnetic shield member in the housing chamber.

2. The current sensor according to claim 1, wherein the positioning and holding mechanism includes:
 a shield position regulating portion configured to regulate the relative position of the magnetic shield member in the housing chamber in a direction intersecting a sandwiching direction of the shield holding portions.

3. The current sensor according to claim 1, wherein in an alternate current circuit including a plurality of the conductive members, a combination of the magnetic core member, the magnetic sensor, and the magnetic shield member is provided for each of the conductive members.

4. The current sensor according to claim 2, wherein in an alternate current circuit including a plurality of the conductive members, a combination of the magnetic core member, the magnetic sensor, and the magnetic shield member is provided for each of the conductive members.

5. The current sensor according to claim 1, wherein the magnetic sensor is a Hall IC including a Hall element as a magnetic detection element.

6. The current sensor according to claim 2, wherein the magnetic sensor is a Hall IC including a Hall element as a magnetic detection element.

7. The current sensor according to claim 3, wherein the magnetic sensor is a Hall IC including a Hall element as a magnetic detection element.

8. The current sensor according to claim 4, wherein the magnetic sensor is a Hall IC including a Hall element as a magnetic detection element.

\* \* \* \* \*